United States Patent [19]

Schuoecker et al.

[11] Patent Number: 4,567,355

[45] Date of Patent: Jan. 28, 1986

[54] METHOD AND OPTICAL APPARATUS FOR CONVERTING RESIDUE NUMBERS INTO POSITIONALLY NOTATED NUMBERS

[75] Inventors: Dieter Schuoecker, Vienna, Austria; Ekkehard Klement, Munich, Fed. Rep. of Germany

[73] Assignee: Siemens Aktiengesellschaft, Berlin & Munich, Fed. Rep. of Germany

[21] Appl. No.: 386,902

[22] Filed: Jun. 10, 1982

[30] Foreign Application Priority Data

Jul. 8, 1981 [DE] Fed. Rep. of Germany ....... 3126987

[51] Int. Cl.⁴ .............................................. G06F 3/00
[52] U.S. Cl. ............................ 235/310; 340/347 DD; 364/746; 356/352
[58] Field of Search ................. 364/713, 746; 356/352; 350/388, 353; 235/310, 311; 340/347 DD

[56] References Cited

U.S. PATENT DOCUMENTS 4,107,783 8/1978 Huang ................................ 364/746

OTHER PUBLICATIONS

Psaltis "Applied Optics" vol. 18, No. 2 Jan. 15, 1979, pp. 163-171.
Tai et al., "Optical Residue Arithmetic Computer with Programmable Computation Modules" Applied Optics, vol. 18, No. 16, Aug. 1979.
"Optical Computation Using Residue Arithmetic," A. Huang et al., Applied Optics, vol. 18, No. 2, Jan., 1979, pp. 149-162.
"Optical Residue Arithmetic: A Correlation Approach," D. Psaltis et al., Applied Optics, vol. 18, No. 2, Jan., 1979, pp. 163-171.
"Optical Bistability in Semiconductors," H. Gibbs et al., Applied Physics Letters 35(6), Sep., 1979, pp. 451-453.
An Optical Arithmic Unit, Huang, Proceedings of Electro Optical System Design Conference, Anaheim, CA Oct. 1977, pp. 208-212.

Primary Examiner—Charles D. Miller
Attorney, Agent, or Firm—Hill, Van Santen, Steadman & Simpson

[57] ABSTRACT

A method and optical arithmetic apparatus for converting residue numbers into positionally notated numbers utilize linear periodic structures which can be shifted relative to one another, each linear periodic structure being allocated to a prime number module of those prime number modules which are utilized in the residue representation of a decimal number, with the duration of the period for a structure being proportional to the module allocated thereto. The structures may be structures for generating standing light waves. The shift of the phase positions of the light waves is undertaken by respective phase modulators with the waves being shifted out of an original phase position in accord with the allocated residue module or the sum of the modules. The decoded result is obtained by noting the values occurring at positions where the structures coincided before shifting by means of the phase modulators and which coincide after the shift.

23 Claims, 6 Drawing Figures ered for the various arithmetic operations, with the absolute value of the number represented by residue numbers not being utilized. Moreover, the arithmetic operations performed on the residue numbers which represent a decimal number can be undertaken in parallel and can therefore proceed simultaneously, thereby achieving a significant increase in the computational speed in comparison to binary operations.
METHOD AND OPTICAL APPARATUS FOR CONVERTING RESIDUE NUMBERS INTO POSITIONALLY NOTATED NUMBERS

BACKGROUND OF THE INVENTION

1. Field of the Invention

The present invention relates to optical arithmetic methods and devices, and in particular to an optical method and device for converting residue numbers into positionally notated numbers.

2. Description of the Prior Art

An alternative to binary representation of data which is currently employed in electronic computers is the representation of data by residue numbers. The representation of data by residue numbers permits computations to be undertaken by means of residue arithmetic which has the significant advantage that no carry is necessary for the calculations, thereby permitting the calculations to be carried out at significantly higher speeds.

An overview of residue arithmetic is found, for example, in Applied Optics, Vol. 18, January 1979 at pages 149–162. Briefly described, residue arithmetic utilizes a plurality of modules $M_i$, where $i = 1, 2, 3 \ldots N$, with the modules $M_i$ being relatively prime numbers, that is, having no common factors. The number of modules $M_i$ may be any selected integer, with a greater number of modules providing a residue representation of greater capacity. The residue representation of a number Z is obtained by dividing Z by each of the prime number modules $M_i$. The respective remainders $R_i$ of each division operation are defined as the residue numbers with the residue number $R_i$ for Z being the least positive integer remainder of the division of Z by $M_i$. The highest number $Z_{max}$ unambiguously representable by a residue number is the product of all of the prime number modules $M_i$ which are utilized, so that:

$$Z_{max} = \prod_{i=1}^{N} M_i.$$

As stated above, residue representation has the advantage that no carry must be undertaken between the individual places of the numbers because only the residue numbers (that is, the remainders) need be retained for the various arithmetic operations, with the absolute value of the number represented by residue numbers not being utilized. Moreover, the arithmetic operations performed on the residue numbers which represent a decimal number can be undertaken in parallel and can therefore proceed simultaneously, thereby achieving a significant increase in the computational speed in comparison to binary operations.

An embodiment for physically representing the residue numbers which correspond to a decimal number and for performing arithmetic operations on the residue numbers in parallel is described in the aforementioned excerpt from Applied Optics, wherein each possible residue number value for a place of the corresponding decimal number has one light path allocated thereto. This requires an extremely large number of parallel light transmission channels, however, this disadvantage is balanced by the very simple drive means which requires only "on" or "off" operations for each light path. This type of spatial modulation is also referred to as "position notation," with a "positionally notated number" being a number which is represented by means of position notation.

An arithmetic operation can be relatively simply executed by means of the above embodiment by means of the interchange of a plurality of light paths, which can be undertaken at one level because the light beams can penetrate one another. Moreover, because only the inputs and outputs of the embodiment are actually through-connected, a particularly fast calculation can be achieved. The combination of residue representation of data and optical position notation thus results in extremely high computational speeds.

A component for realizing linear functions of a variable utilizing residue numbers is described in the above-identified article in Applied Optics. Given such linear functions of a variable such as, for example, addition or multiplication with a constant, a residue of the function value is unambiguously allocated to each residue of the argument. Thus, the value set of the function is just as large as the value set of the argument. With the utilization of spatial position notation, one arithmetic component must exist for each place, that is, for each prime number module, with the arithmetic element exhibiting a number of inputs and outputs which is equal to the number of possible residue values which may occur at that place. As described in the Applied Optics article, a linear function can be realized by means of simply interchanging the outputs relative to the inputs of the component. Accordingly, such a linear function can be realized by means of components with a fixed map of connections between the inputs and the outputs of the device.

Such an interchange of the position of the entering and exiting light can be achieved by means of light conductors or by deflection of the entering light beams by means of mirrors, grids or prisms. Such a device can function much faster than electronic arithmetic devices, because an arithmetic operation lasts only as long as is required for the light to propagate from the input to the output.

For realizing linearly variable functions such as, for example, addition and multiplication with variables instead of with constants, the map of the device must be variable as well. As further described in the Applied Optics article, a device for addition and multiplication of two numbers by means of residue representation utilizing position notation can be realized in the form of a surface light conductor of rectangular shape into which narrow diagonally proceeding regions are built having indices of refraction which can be varied so that total reflection can occur in these regions. When the regions are selectively disposed, various interchanges of the positions of the light between the input and output can be obtained depending upon which region has been switched to total reflection. Switching of the index of refraction to values less than that of the light conductor can be undertaken electrically or electro-optically, however, it is also possible to switch these regions by means of light beams such as, for example, in a gallium arsenide light conductor in which the index of refraction is altered due to the incidence of a control light beam as a result of the destruction of excitons. Such a switching means is described in Applied Physics Letters 35 (1979) at pages 451–453.

SUMMARY OF THE INVENTION

It is an object of the present invention to provide an optical arithmetic unit and a method for operating same for conducting arithmetic operations utilizing residue arithmetic which is compatible with conventional binary data processing systems. The above object is inventively achieved in an apparatus and method for operating same which employ an optical arithmetic means for processing residue numbers, such as an optical adder, in combination with an encoder means for converting a plurality of differently encoded input numerals transmitted in parallel by means of a respective light path per numeral into residual numbers, and in further combination with a decoder means which converts the residual numbers back into a differently encoded output number, all in a single unit.

An exemplary arithmetic unit constructed and operating in accordance with the principles of the present invention converts two binary numbers transmitted in parallel via a respective light path per binary place into residue numbers for residue representation, an optical arithmetic unit for adding two numbers existing in residue representation, and a converter for converting the resulting residue number sum back into a binary or decimal number. The conversion of a binary number into its residue representation is very simple when the addition is governed by residue numbers because one need add only the residue numbers of the place values for all of those binary places which exhibit the binary value "1".

The addition of two random residue numbers with the saw within the area $$0 < \frac{N}{\pi} M_1$$
$$i=1$$

and the conversion of the results into a binary or decimal number constitute the most difficult problems for the physical realization of an optical arithmetic unit utilizing residue arithmetic.

The optical arithmetic unit utilized in the combination disclosed and claimed herein may utilize the concept of converting residue numbers into positionally notated numbers. A device for converting residue into decimal representation is disclosed in Applied Optics, Vol. 18, January 1979 at pages 163-171 in which the conversion is undertaken by means of two spatial Fourier transformations by means of lenses and a grating, whereby the converted number can be read in decimal position notation, that is, can be read at the position of a light beam relative to a linear scale. Such an arrangement with discrete optical components such as lenses and gratings, however, is not suitable for planar integration, as is desirable in modern arithmetic units for use in complex systems.

Accordingly, the method and apparatus disclosed and claimed herein make use of linear periodic structures, such as a Fabry-Perot filter, for obtaining the representation by residue numbers, the structures being shiftable in the longitudinal direction relative to one another with the period length for each structure being equal to the product of the spacing between two adjacent positionally notated numbers and the module allocated to the particular structure.

The realization described in the above paragraph is purely optical, however, a further embodiment of the invention which operates purely mechanically employs a number of superimposed perforated masks with equidistant holes whose spacing is determined by the primary number modules.

Another purely optical embodiment of the invention can be realized by the generation of interference patterns generated by a number of light beams from different sources which are superimposed on a planar surface, with each light source having a phase modulator associated therewith with the phase modulation of the respective light beams corresponding to the residue value associated therewith.

An adder for residue numbers utilizing the teachings disclosed herein simultaneously decodes the residue numbers and thus can be simultaneously employed as a device for converting a residue number into a differently encoded number. An extremely fast and economically constructed optical arithmetic unit is thus achieved in which the device for converting the residue numbers into positionally notated numbers simultaneously serves as an optical adder for the residue numbers.

A device for converting residue numbers into positionally notated numbers or an adder for residue numbers is operated in such a manner in accordance with the principles of the present invention that the periodic structures are shifted from an original phase position in accordance with the prescribed allocated residue numbers, or sums of these numbers, and the decoded result is obtained by identifying those positions at which the phases of the individual structures were coincident before the shift and which coincide after the shift as well.

DESCRIPTION OF THE PREFERRED EMBODIMENTS

Figure 1:
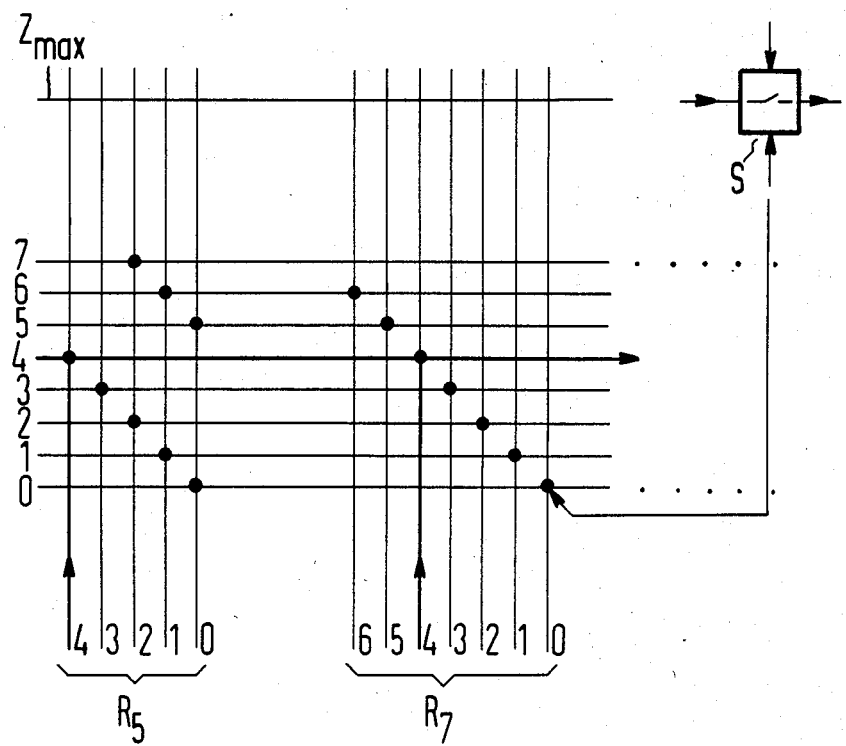
FIG. 1 is schematic representation of a theoretical device utilized for explaining the inventive concept disclosed and claimed herein.

In order to fully describe the inventive concept disclosed and claimed herein, the conversion of residue numbers into positionally notated decimal numbers will be discussed in detail. The conversion of residue numbers $R_1 \ldots R_n$ into decimal numbers Z can be undertaken utilizing position notation and can be theoretically undertaken by a rectangular matrix consisting of a plurality of intersecting light paths. Such a matrix is schematically represented in FIG. 1 in which the horizontal and vertical lines denote light paths. The horizontal lines represent the decimal numbers. Groups of vertical lines represent the residue numbers associated with respective moduli. Each group of vertical lines represents one module $M_i$ and contains $M_i$ vertical lines. Thus the group $R_5$ contains five vertical lines corresponding to the residue numbers 4, 3, 2, 1 and 0 which are the possible remainders which may occur upon division of a decimal number by the module $M_5=5$. Similarly, the group $R_7$ includes light paths corresponding to the residue numbers 6, 5, 4, 3, 2, 1 and 0 which are the possible remainders which may occur as a result of division of a decimal number by the module $M_7=7$. An intersection of light paths is represented by a black dot in FIG. 1 which indicates a switch element schematically represented as a switch S in FIG. 1 which is driven open and shut by means of the vertical light path associated therewith and which thus transmits or interrupts the horizontal light path associated therewith. Only a portion of a total matrix is shown in FIG. 1, with the total matrix including groups of vertical light paths associated with each module $M_i$.

When a switch in a horizontal light path is actuated by a vertical light beam at those locations for which the equation $Z_n=nM_i+R_i$ (wherein i=1, 2 ... N) is satisfied, those vertical paths which correspond to the residue numbers are illuminated by a light beam and all switches which lie in the horizontal line for which the above equation is satisfied are closed in each group of vertical light paths. The horizontal line in which all switches are closed corresponds to the resulting decimal number Z which satisfies all of the equation $n_1M_1+R_1=n_2M_2+R_2=\ldots=NM_N+R_N$.

When, for example, binary numbers with 16 places as are standard for electronic data processing are to be processed by residue representation, a matrix of the type described above must comprise approximately 64 thousand horizontal lines and approximately 100 vertical lines. The state of technology for integrated optics presently available does not permit packing such a large number of light conductors in an optical component within a reasonable space allocation. The required switching elements cannot be packed in such a high number because purely optical switches do not exist and the switches utilized must function opto-electronically. The necessity of disposing such a large number of discrete light paths in close adjacency without crosstalk is also not possible with conventional optical technology.

Figure 2:
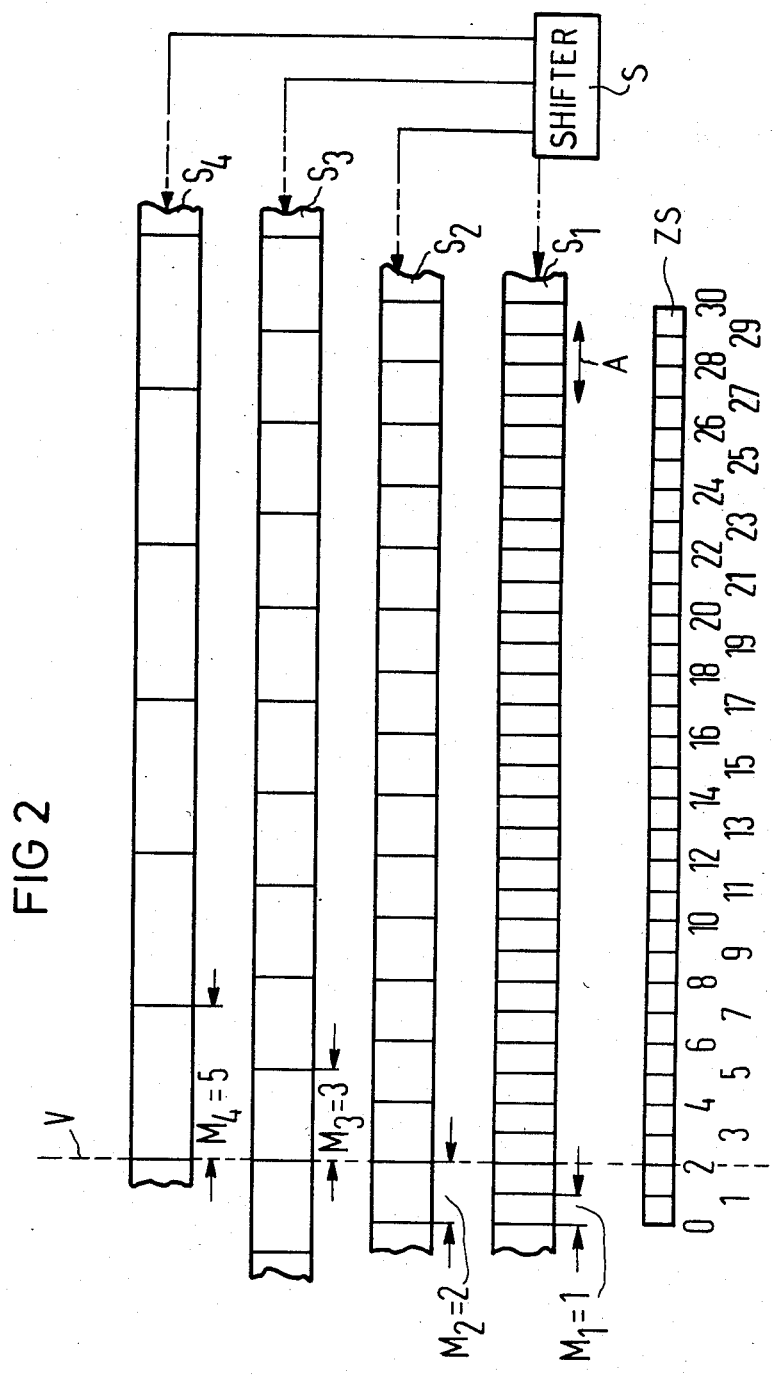
FIG. 2 is a schematic representation of a mechanical embodiment of an apparatus for converting residue numbers into positionally notated numbers.

The above problems associated with the theoretical structure shown in FIG. 1 are eliminated in the mechanical embodiment shown in FIG. 2 utilizing the concept of a plurality of periodic linear structures having respective period lengths proportional to a prime number module $M_i$ allocated thereto. In the embodiment shown in FIG. 2, four masks $S_1$, $S_2$, $S_3$ and $S_4$ are utilized having periodically spaced perforations therein represented by the vertical lines in each mask which are proportional to the module $M_i$ respectively associated therewith. In the exemplary embodiment shown in FIG. 2, four modules are utilized with $M_1=1$, $M_2=2$, $M_3=3$ and $M_4=5$. This permits unambiguous representation of decimal numbers up to $Z_{max}=30$, which is the product of the modules.

The decimal numbers 0 through 30 are positionally noted on a linear scale ZS. The periodic linear structures formed by the masks $S_1$, $S_2$, $S_3$ and $S_4$ are shiftable relative to each other in a linear direction, that is, in the direction of the double arrow A, by any suitable shifting means S.

The spacing between the equidistant perforations in the masks $S_1$ through $S_4$ are multiples of the spacing between the perforations in the mask $S_1$ corresponding to the primary module $M_1$. Thus the spacing between the perforations in the mask $S_2$ is double that of the primary spacing, the spacing in the mask $S_3$ is triple the primary spacing, and the spacing between the perforations in the mask $S_4$ is five times the primary spacing.

Utilizing the mechanical embodiment shown in FIG. 2 in order to convert a residue number into a positionally noted number, the four masks $S_1$ through $S_4$ are shifted to a position such that a perforation in each of the masks is aligned with "0" on the linear decimal scale ZS. Each mask $S_1$ through $S_4$ is then shifted to the right by an amount determined by the residue allocated to the prime number module $M_i$ respectively associated therewith. The location at which the perforations in all of the structures, a total of four perforations, are in registry and thus lie on a vertical line V indicates the positionally noted number corresponding to the residue number. In the embodiment shown in FIG. 2, the positionally noted number "2" is indicated, because four perforations on the vertical line V proceed through the positionally noted number "2" on the linear scale ZS.

With the modules $M_1$ through $M_4$ being the prime numbers identified above the following equations are satisfied: $2=2\cdot M_1 0=1\cdot M_2+0=0\cdot M_3+2=0\cdot M_5+2$, so that given this set of modules the decimal number 2 is represented by the residue number (0, 0, 2, 2). This means that the masks $S_1$ and $S_2$ are not shifted from their 0 position, whereas the masks $S_3$ and $S_4$ are shifted two units toward the right. When this operation is completed, the configuration shown in FIG. 2 results.

The registry of perforations in the masks $S_1$ through $S_4$ with a number on the linear scale ZS can be determined, for example, by utilizing a light beam corresponding to the vertical line V which is transmitted through all of the masks when the masks are appropriately aligned in a manner representing the residual number for the decimal number in question.

The inventive concept disclosed and claimed herein can also be realized by means of linear periodic structures which are purely optical, rather than mechanical, by means of the generation of standing light waves in those structures. The nodes of the standing waves correspond to the perforations in the masks in the mechanical embodiment, the positions of the nodes in the different linear optical structures being determined by the relative phases of the standing waves in those structures. Shifting of the standing waves can be undertaken by means of phase modulators which are disposed in front of the reflectors required for generating the standing waves in each linear optical structure. The modulator can operate by means of dispersive effects induced by an incident light beam such as, for example, reduction of the index of refraction of III-V semiconductors as a result of the destruction of excitons, so that the modulator can be controlled by a light beam and thus a purely optical embodiment can be realized.

Figure 3:
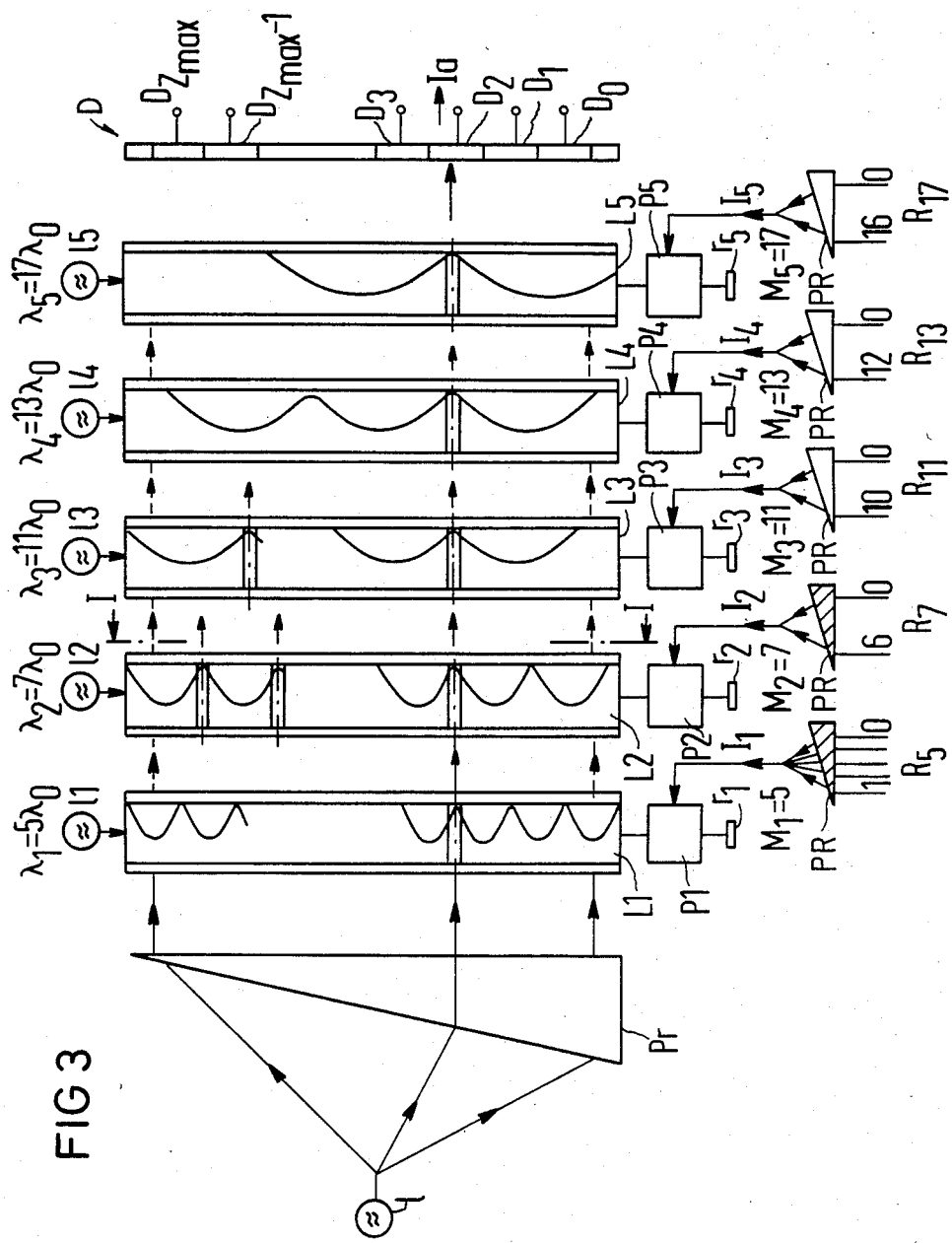
FIG. 3 is an optical embodiment employing periodic structures for generating standing light waves for converting residue numbers into positionally notated numbers.

Such a purely optical embodiment is shown in FIG. 3. In this embodiment, the standing waves are generated in parallel waveguides L1, L2, L3, L4 and L5 which consist of a material having an index of refraction which is variable by means of incident light and which have longitudinal sides which are mirrored so as to be partially reflecting. The waveguides L1 through L5 thus form Fabry-Perot filters in the transverse direction which are transparent for critical values of the index of refraction in the transverse direction. With a suitable dimensioning of the width of the waveguides, each individual waveguide is highly transmissive for transverse incident light at precisely those locations where the nodes of the standing wave in the filter are located, and is only slightly transmissive at all other locations.

Light sources 11, 12, 13, 14 and 15 emit light of different wavelengths and are respectively connected to the waveguides L1 through L5 for generating the standing waves therein. Each of the light sources 11 through 15 emits light having a wavelength which is a multiple of a base wavelength $\lambda_O$. The multiple is equal to the module which is associated with the waveguide. In the exemplary embodiment of FIG. 3, the modules have been selected $M_1=5$, $M_2=7$, $M_3=11$, $M_4=13$ and $M_5=17$. The respective residues $R_5$, $R_7$, $R_{11}$, $R_{13}$ and $R_{17}$ associated with these prime number modules can respectively assume the numbers 0 through 4, 0 through 6, 0 through 10, 0 through 12 or 0 through 16.

The reflectors respectively associated with each waveguide for generating the standing waves in the waveguide are referenced at $r_1$, $r_2$, $r_3$, $r_4$ and $r_5$. Phase modulators P1 through P5, respectively driven by light beams $I_1$ through $I_5$ are disposed between each waveguide and the reflector associated therewith. The phase shift produced by each phase modulator increases with increasing intensity of the controlling light beam incident on the phase modulator.

The intensity of the controlling light beams $I_1$ through $I_5$ must be able to be varied in steps, that is, in accordance with the possible residue values for the particular module associated therewith. Thus, for example, the light beam $I_1$ must be able to be varied in five intensity steps which correspond to the residue values 0, 1, 2, 3 and 4 of the residue $R_5$. The controlling light beams $I_2$ through $I_5$ must be able to be respectively varied in 7, 11, 13 and 17 intensity steps. The stepwise change of intensity of the light beams $I_1$ through $I_5$ is undertaken by means of superimposing individual light beams such as, for example, by prisms PR.

The waveguides L1 through L5 are transversely irradiated with a planar light wave generated by a light source 1 and a prism Pr. The waveguides are transmissive for this light at the nodes of the standing waves generated therein. The entire waveguide structure is, however, permeable for this light only via a path located where the nodes of all of the waveguides are in registry in the direction of propagation of the planar light waves. Such a path is formed only at a specific location and this specific location at which the light emerges from the last waveguide L5 in the total waveguide structure indicates the positionally notated number.

In order to identify the position of the light beam which emerges from the last waveguide L5, a detector array D may be employed having $Z_{max}+1$ light sensitive individual detectors $D_O$ through $D_{Zmax}$. The positionally notated number for the residual number can thus be obtained by a signal received from one of the detectors in the array D. In the embodiment shown in FIG. 3, light travels in a path through the waveguides L1 through L5 so as to be incident on detector $D_2$ causing a signal Ia to be generated indicating the positionally notated number "2".

The optical embodiment shown in FIG. 3 is well-adapted for physical realization by means of integrated optics and permits the conversion of residue numbers into a positionally notated number to be undertaken extremely rapidly as a result of the parallel operating mode.

In a further embodiment of the invention, the linear periodic structures can be realized by means of interference such as, for example, by double-beam interference in which the super position of two planar light waves having respective propagation directions which define an angle. The superposition of the two light waves generate an amplitude distribution corresponding to a standing wave in a plane which is perpendicular to both propagation directions. The spacing $\Gamma$ of the interference bands is defined by the wavelength $\lambda$ of the two light waves and the angle $\alpha$ between the two propagation directions in accordance with the equation:

$$\Gamma = \frac{\lambda}{2\sin(\alpha/2)\cos\beta}$$

It can be seen that $\Gamma$ becomes very large for small angles $\alpha$. The angle $\beta$ is the angle between the observation plane and a line which is normal to the bisector of the angle $\alpha$. The shift of interference bands necessary for representing individual residue values can be generated by means of a phase modulator which shifts the phase position of one of the two light waves.

Because such an interference pattern must be generated for each of the prime number modules employed in the residue representation, the band spacing of the interference pattern being proportional to the module associated therewith, a number of differently directed light beams must be utilized.

Figure 4:
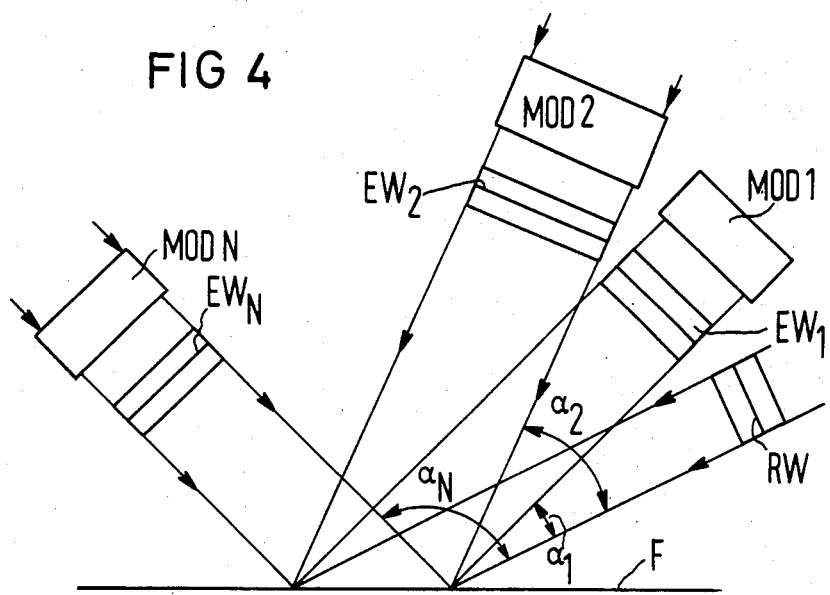
FIG. 4 is a second optical embodiment of an apparatus constructed in accordance with the principles of the present invention in which the periodic structures are realized by means of interference patterns.

Such an embodiment is shown in FIG. 4 for residue numbers based on N modules $M_1$, $M_2$ ... $M_N$. In order to generate the N interference patterns required, N planar waves $EW_1$, $EW_2$ ... $EW_N$ are employed which interact with a reference wave RW at N different angles $\alpha_1, \alpha_2, \ldots \alpha_N$ to generate the interference pattern. The resulting interference pattern is formed in a plane which is perpendicular to the plane of the drawing containing FIG. 4 and containing all propagation directions. The interference pattern corresponds to the coherent superposition of N+1 waves. A screen F is disposed in the plane in which the interference pattern arises. Each of the planar waves $EW_1$, $EW_2$ ... $EW_N$ is transmitted through a respective phase modulator MOD1, MOD2 ... MODN by means of which the phase position of the wave passing therethrough can be shifted.

A further embodiment of the apparatus according to the invention can be obtained, if instead of one reference beam RW generator which generates a single reference wave interacting with all of the planar waves from generators $EW_1$, $EW_2$ ... $EW_N$, for every planar wave from generators $EW_1$, $EW_2$ ... $EW_N$ one specific reference wave is allocated with the same angle of incidence as its corresponding modulated wave.

When the phase positions of the N incident waves are shifted in accordance with the given N residue values, the bands of the N interference patterns are similarly shifted on the screen F and, on a linear scale associated with the screen F, the positionally noted number corresponding to the residue value can be read at the angle location where all N interference patterns exhibit a common maximum. This evaluation may be undertaken, for example, in a manner similar to that shown in FIG. 3 by means of an opto-electronic detector array. The detector at which the maximum is located emits a characteristic signal which indicates the positionally notated number in a suitably encoded form.

The embodiment shown in FIG. 4 may also be realized by means of integrated optics such as, for example, by means of N strip-shaped waveguides which proceed at N acute angles $\alpha_1, \alpha_2 \ldots \alpha_N$ relative to a reference waveguide, each of the strip-shaped waveguides having a phase modulator associated therewith.

As in the embodiment shown in FIG. 3, the modulator MOD1, MOD2 ... MODN shown in FIG. 4 must be controllable to provide a spatial shift for each interference pattern proportional to the respectively allocated, but variable, residue value. The residue values generally exist in position notation and therefore each of the modulators in the embodiment shown in FIG. 4 may consist of N individual modulators connected in series, each individual modulator generating one phase shift out of the total number of phase shifts corresponding to the possible residue values.

As in the embodiment shown in FIG. 3, because all of the residue values in the embodiment of FIG. 4 are represented by means of light paths, it is preferable that the individual modulators be optically controllable. Each modulator in the embodiment of FIG. 4 will then have a control light beam respectively associated therewith for setting the modulator so as to generate precisely that phase shift which corresponds to the positionally notated number which is determined by the light path supplied thereto. Such optical control, although advantageous, is not absolutely necessary. The position notation of the possible residue values is already given by the spatial disposition of the individual modulators alone and the phase shifts allocated to the residue values which result thereby.

If the double-beam interference does not result in a sufficiently sharp common maximum or minimum or to a common maximum or minimum which are readily distinguishable from the environment, a multi-beam interference may be utilized instead of the doublebeam interference. A Fabry-Perot interferometer is, for example, suitable for this purpose. Given such an interferometer, the band spacing, unlike the spacing in the double-beam interference, is not constant when a planar screen is employed but instead the spacing increases radially from a center of the interference pattern in the form of concentric rings. A suitably arced screen may be employed, however, to counteract the increasing band spacing in order to obtain a constant band spacing.

An adder for residue numbers can be constructed utilizing either of the embodiments shown in FIGS. 3 and 4. For this purpose, instead of one modulator per periodic structure, a plurality of modulators, corresponding to the plurality of residue numbers to be added, must be provided. Each modulator in the plurality of modulators must be controlled by means of signals which correspond to the residue numbers to be added. Moreover, a linear scale must be disposed next to each of the periodic structures in order to obtain the positionally notated number corresponding to the possible residue values.

Figure 5:
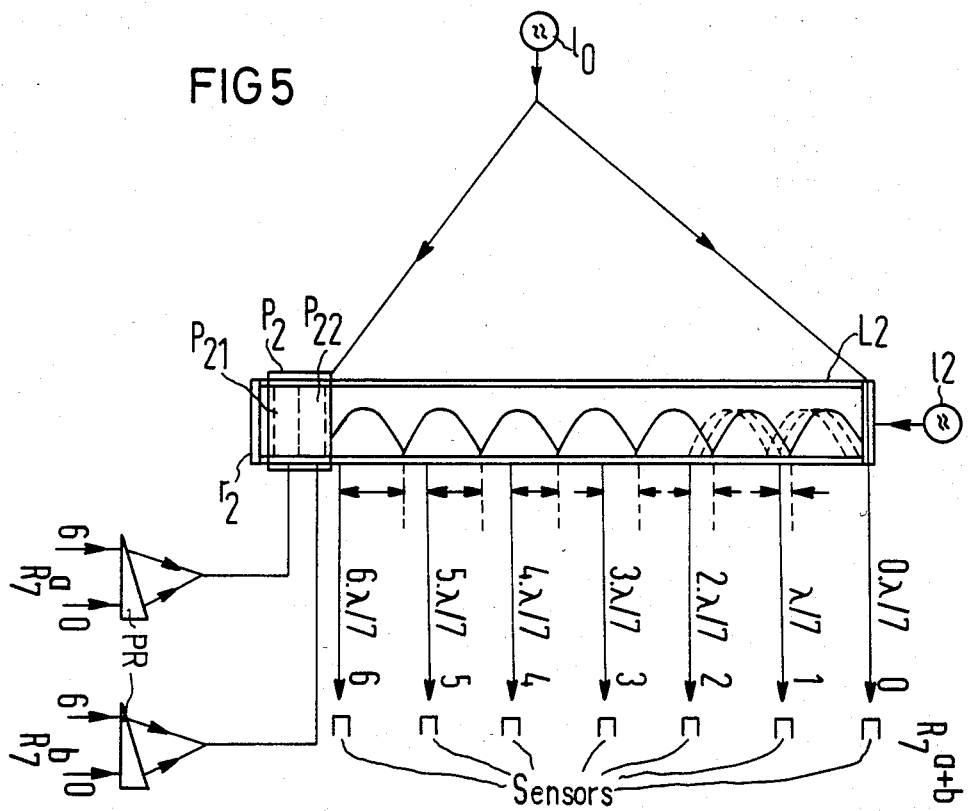
FIG. 5 is an adder constructed in accordance with the principles of the present invention compatible with the embodiment shown in FIG. 3.

A first embodiment of such an adder is shown in FIG. 5, which is compatible with the structure shown in FIG. 3. The embodiment shown in FIG. 5 represents a cross-section taken along line I—I of FIG. 3. Sensors which positionally note the possible residue values 0 through 6 of the residue $R_7$, associated with the prime number module 7, are disposed below the waveguide L2. The spacing of the sensors from one another is proportional to 1/7 of the wavelength of the standing wave in the waveguide L2. Generally, the spacing between adjacent sensors is selected proportional to the quotient obtained from the period length of one of the periodic linear structures and the module associated with that structure. The sensors are disposed under each existing linear periodic structure, thus, under each of the waveguides L1 through L5.

A significant difference in the structure shown in FIG. 5 from that shown in FIG. 3 is that each modulator in the structure of FIG. 5 is comprised of two individual modulators which are separately driven by means of the two residue values which are to be added. In FIG. 5, a first residue value $R_7^a$ controls a first individual modulator $P_{21}$ and a second residue value $R_7^b$ controls a second individual modulator $P_{22}$.

During operation of the adder, the adder is illuminated from above by a light source $l_0$ and standing waves are generated in the waveguide. The shifts of the respective standing waves generated by the two modulators correspond to an overall shift which corresponds to the sum value $R_7^{a+b}$ of the residues to be added. This value is displayed by a node of the standing wave, and thus a transparent location in the waveguide above a specific sensor, so that light from the source $l_0$ strikes the sensor and the positional number associated with the irradiated sensor corresponds to the sum value.

A single half wave is theoretically sufficient for such an adder, however, in order to increase the precision of the adder the sensor may be associated with a different half wave for each value of the residue, as shown in FIG. 5. The adder functions completely in parallel and is therefore extremely rapid.

Figure 6:
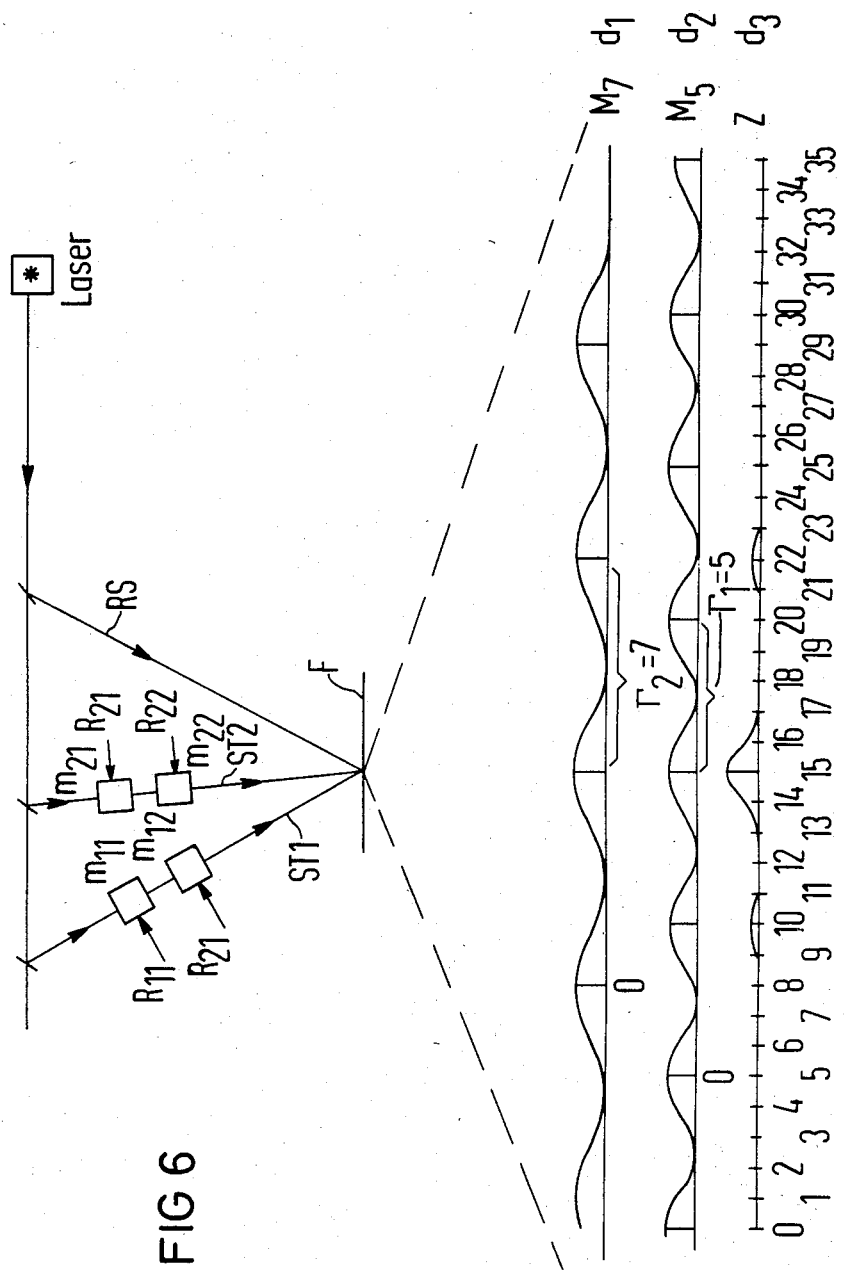
FIG. 6 is an adder embodying the inventive concept disclosed herein with the embodiment shown in FIG. 4.

An optical adder compatible with the structure of FIG. 4 is shown in FIG. 6 operating by generating an interference pattern. In this embodiment of an adder, a laser supplies a beam which is utilized to form a reference beam RS, a first beam ST1 and a second beam ST2 which are reflected by semi-reflective mirrors onto a screen F. Two phase modulators $m_{11}$ and $m_{12}$ are disposed in series in the path of the first beam ST1 and two phase modulators $m_{21}$ and $m_{22}$ are disposed in series in the path of the second beam ST2.

In the embodiment shown in FIG. 6, modules $M_5=5$ and $M_7=7$ are utilized for the residue representation so that $Z_{max}=35$. Two residue numbers $(R_{11}, R_{12})=(1, 6)$ and $(R_{21}, R_{22})=(4, 2)$ are to be added. These two residue numbers are the residue representation for the two decimal numbers 6 and 9.

The interference patterns appearing on the screen F are schematically illustrated in enlarged format and are correlated with a scale Z on which the numbers 0 through 35 are equidistantly represented. For purposes of clarity, the secondary lobes of the interference pattern have been omitted. The pattern $d_1$ is the interference pattern generated on the screen F by the beam ST2 and the reference beam RS. The band spacing $\Gamma_2$ of the interference pattern for the module $M_7$ amounts to 7 scale units. The two modulators $m_{21}$ and $m_{22}$ effect a phase shift which corresponds to $R_{12}+R_{22}$. In this numerical example, this corresponds to 8 scale units, so that the phase position of the interference pattern $d_1$ is shifted 8 units toward the right with respect to the 0 position of the Z scale. The shifted position of the 0 point for the pattern $d_1$ is thus shown in registry with the eighth unit on the Z scale. Similarly, the interference pattern $d_2$ generated by the beam ST1 has a strip spacing $\Gamma_1$ corresponding to five scale units and the modulators $m_{11}$ and $m_{12}$ shift the phase position of the interference pattern toward the right by $R_{11}+R_{21}$. This corresponds to a shift of five scale units so that the 0 point for the pattern $d_2$ now is in registry with the fifth unit of the Z scale.

The intensity maxima for the two patterns $d_1$ and $d_2$ are represented by the equidistant vertical strokes. The maxima of both interference patterns $d_1$ and $d_2$ coincide at 15 on the Z scale, meaning that the actual interference pattern which is generated by all three beams on the screen S exhibits a clear maxima at that location. This corresponds to the pattern $d_3$, superimposed on the Z scale, wherein this maximum is identified by a vertical stroke. Because the two residue numbers correspond to the decimal numbers 6 and 9, the sum of the residue numbers corresponds to the decimal number 15 on the Z scale.

The adder shown in FIG. 6 is thus an optical arithmetic unit which not only conducts an addition operation but also converts the residue numbers into a differently encoded form, such as position notation. The speed with which the calculation can be undertaken is significantly increased over conventional devices because all calculations are undertaken in parallel, as in the embodiments discussed above.

Although modifications and changes may be suggested by those skilled in the art it is the intention of the inventors to embody within the patent warranted hereon all changes and modifications as reasonably and properly come within the scope of their contribution to the art.

We claim as our invention:

1. An optical device for processing residue numbers comprising one unit including an encoder means for converting differently encoded input numbers in parallel into residue numbers by selectively interrupting a plurality of light paths respectively allocated to each possible numeral in said residue number, an arithmetic means for airthmetically operating on said residue numbers, and a decoder means for converting a result of said residue numbers, and a decoder means for converting a result of said arithmetic operation into a positionally notated number, said decoder means comprising a light source and a plurality of linear periodic structures irradiated by said light source having respectively different constant periods for differently modulating light incident thereon and being disposed such that light modulated by each linear period structure is superimposed with light modulated by all of the other linear periodic structures, said linear periodic structures being respectively allocated to each module utilized for said residue numbers, a scale of equidistantly spaced positionally notated numbers on which said modulated light is superimposed, and a means for individually shifting said linear periodic structures with respect to said scale until an end of a period in each linear periodic structure is aligned with an end of a period in each of the other linear periodic structures, the period for each linear periodic structure being the product of the spacing between adjacent positionally notated numbers on said scale and the module allocated to the linear periodic structure and a reading on said scale when said ends of periods are aligned indicating a positionally notated number for said residue number.

2. The optical device of claim 1 wherein said plurality of linear periodic structure are a plurality of superimposed perforated masks, each of said masks having a plurality of equidistantly spaced perforations therein, the spacing between the perforations in respective masks being determined by the product of the spacing between adjacent positionally notated numbers and the module respectively allocated to a mask.

3. The optical device of claim 1 wherein said plurality of linear periodic structures are a plurality of light-transmissive structures each having a standing light wave therein, each standing light wave having a different period and wherein said means for shifting said linear periodic structures is a plurality of phase modulators respectively connected to said linear periodic structures for shifting the phase of the respective standing light waves therein.

4. The optical device of claim 3 wherein said light-transmissive structures are comprised of an optical medium having a variable index of refraction and wherein said phase modulators each include a means for changing the index of refraction of the light-transmissive structure connected thereto.

5. The optical device of claim 4 wherein said optical medium is comprised of a material having an index of refraction which is variable in response to the intensity of light incident on said medium, and wherein said phase modulators vary said indices of refraction in said light-transmissive structures by directing a light beam of selectively variable intensity thereon.

6. The optical device of claim 5 wherein said light beam intensity is selectively variable in a plurality of steps corresponding to the number of said possible numerals in the residue number corresponding to the module allocated to said light-transmissive structure.

7. The optical device of claim 6 wherein said decoder means further comprises a plurality of prisms respectively optically connected to said phase modulators for supplying a control light beam thereto, each control light beam consisting of a plurality of component light beams which is less than or equal to the residue number for the module allocated to the linear periodic structure to which a phase modulator is connected.

8. The optical device of claim 3 wherein each of said plurality of light transmissive structures has a pair of parallel longest sides and an end mirror disposed at right angles to said longest sides for creating said standing wave therein.

9. The optical device of claim 8 wherein said decoder means further comprises means for directing a transverse light wave from said light source through said light-transmissive structures perpendicular to said longest sides and wherein each of said longest sides is semireflective such that said light-transmissive structures function as Fabry-Perot filters which are transparent for said light wave only at the nodes of the standing wave therein, whereby said light wave is transmitted through said light transmissive structures in a path defined by the registry of one node of each of said standing waves.

10. The optical device of claim 9 wherein said decoder means further comprises a sensor array disposed in the direction of propagation of said light wave after said light transmissive structures, said sensor array generating a signal indicating a positionally notated number when a sensor in said sensor array is irradiated by light transmitted through said light-transmissive structures.

11. The optical device of claim 3 wherein said standing waves have respective wavelengths which are respective multiples of a base wavelength and wherein said multiples are the modules to which the light-transmissive structures are allocated.

12. The optical device of claim 1 wherein said plurality of linear periodic structures is a plurality of interference patterns generated by an interference device including at least two interferring light waves, said interference patterns being respectively allocated to said modules, and wherein said means for individually shifting said linear periodic structures is a means for shifting the phase of at least one of said interferring light waves for each interference pattern.

13. The optical device of claim 12 wherein said interference patterns are a plurality of double-beam interference patterns, each double-beam interference pattern being allocated to one of said modules.

14. The optical device of claim 13 wherein said interference device includes a Fabry-Perot interferometer for at least one of said light waves and wherein said double-beam interference patterns are respectively generated by a plurality of light waves respectively allocated to said modules interferring at a selected angle with a like plurality of reference light waves.

15. The optical device of claim 12 wherein said interference patterns are multi-beam interference patterns and wherein said interference means is a plurality of light waves respectively allocated to said modules all interferring at different angles with a single reference light wave.

16. The optical device of claim 15 further comprising an arced screen on which said multi-beam interference pattern is displayed having an arc such that the distances between the bands in said multi-beam patterns are equal.

17. The optical device of claim 12 wherein said plurality of linear structure are a plurality of interference patterns generated by a plurality of pairs of interferring light waves and wherein said means for shifting said linear periodic structures is a plurality of pairs of phase modulators for respectively varying the phases of said pairs of interferring light waves by respective amounts corresponding to said residue numbers to be added.

18. The optical device of claim 12 wherein said interference patterns are multi-beam interference patterns and wherein said interference means is a plurality of light waves respectively allocated to said modules and respectively interfering with respective ones of a like plurality of reference light waves, each light wave having the same angle of incidence as the respective reference light wave with which said light wave interferes, and wherein said angles of incidence are different for each of said light waves.

19. The optical device of claim 1 wherein said arithmetic operation is addition and wherein said decoder means is an adder for simultaneously performing said arithmetic operation and converting the result of said operation into a differently encoded output number.

20. The optical device of claim 19 wherein said plurality of linear periodic structures are a plurality of light-transmissive structures each having a standing light wave therein, each standing light wave having a different period and wherein said means for shifting said linear periodic structures is a plurality of pairs of phase modulators respectively connected to said linear periodic structures, each phase modulator in said pair of phase modulator shifting the phase of the standing light wave in the linear periodic structure connected thereto by an amount corresponding to one of said residue numbers to be added.

21. A method for converting residue numbers into positionally notated numbers in a device having a plurality of linear periodic structures each having different periods, said linear periodic structures being respectively allocated to each module utilized for said residue numbers and the period for each linear periodic structure being the product of the difference between adjacent positionally notated numbers and the module allocated to the linear periodic structure, said method comprising the steps of:
  irradiating said linear period structure with light;
  simultaneously modulating said light with each of said linear periodic structures;
  superimposing light modulated by each of said linear period structures on a scale of equidistantly spaced positionally notated numbers;
  individually shifting said periodic structures with respect to said scale until an end of a period in each linear periodic structure is in registry with an end of a period in each of the other of said linear periodic structures; and
  correlating the position at which said registry of said ends of said periods occurs with a positionally notated number on said scale.

22. The method of claim 21 wherein said linear periodic structures are Fabry-Perot interferometers each having a standing wave therein with a different period and wherein the step of shifting said linear periodic structures is accomplished by the step of modulating the respective phases of said standing waves in said Fabry-Perot interferometers until all of said standing waves have a node in registry with a node of each of said standing waves.

23. The method of claim 21 wherein said linear periodic structures are interference patterns each comprised of two interferring light waves and wherein the step of shifting said linear periodic structures is accomplished by the step of modulating the phase of one of said two interferring light waves for each of said interference patterns until a maximum of an interference pattern is in registry with a maximum in each of said interference patterns.

* * * * *